(12) United States Patent
Enomoto

(10) Patent No.: US 7,777,328 B2
(45) Date of Patent: Aug. 17, 2010

(54) SUBSTRATE AND MULTILAYER CIRCUIT BOARD

(75) Inventor: Ryo Enomoto, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 12/179,959

(22) Filed: Jul. 25, 2008

(65) Prior Publication Data

US 2008/0277776 A1 Nov. 13, 2008

Related U.S. Application Data

(63) Continuation of application No. PCT/JP2007/051249, filed on Jan. 26, 2007.

(30) Foreign Application Priority Data

Jan. 27, 2006 (JP) ............................ 2006-019141

(51) Int. Cl.
*H01L 23/485* (2006.01)
(52) U.S. Cl. .................. 257/700; 257/678; 257/670; 257/733; 257/787; 257/795; 257/796; 257/E23.001; 257/E23.194; 257/E23.019
(58) Field of Classification Search ......... 257/678–733, 257/787–796, E23.001–E23.194, 780
See application file for complete search history.

(56) References Cited

U.S. PATENT DOCUMENTS 5,763,939 A * 6/1998 Yamashita .................. 257/668

6,027,791 A * 2/2000 Higashi et al. .............. 428/209
6,287,892 B1 * 9/2001 Takahashi et al. ........... 438/107
7,239,014 B2 * 7/2007 Ogawa et al. ............... 257/700
7,378,745 B2 * 5/2008 Hayashi et al. ............. 257/778

FOREIGN PATENT DOCUMENTS

| JP | 2001-237344 | 8/2001 |
|---|---|---|
| JP | 2002-141440 | 5/2002 |
| JP | 2003-218282 | 7/2003 |

* cited by examiner

*Primary Examiner*—Wael M Fahmy
*Assistant Examiner*—Marc Armand
(74) *Attorney, Agent, or Firm*—Ditthavong Mori & Steiner, P.C.

(57) ABSTRACT

A substrate includes a inorganic material base board has a recess and at least one penetration hole provided around the recess, and a semiconductor device accommodated in the recess and including at least one electrode pad provided on a surface of the semiconductor device. A resin filling is provided in the at least one penetration hole and has at least one through-hole for electrically connecting a top surface and a back surface of the resin filling. An insulating layer covers the surfaces of the semiconductor device, the resin filling and the inorganic material base board and has a first opening corresponding to the at least one through-hole and a second opening corresponding to the at least one electrode pad. A conductive wiring is formed on a surface of the insulating layer for electrically connecting the at least one through-hole and the at least one electrode pad.

6 Claims, 11 Drawing Sheets

SUBSTRATE AND MULTILAYER CIRCUIT BOARD

CROSS-REFERENCE TO RELATED APPLICATIONS

The present application is a continuation application claiming priority under 35 U.S.C. §120 to International Application No. PCT/JP2007/051249 filed Jan. 26, 2007, which claims priority to Japanese Patent Application No. 2006-019141, filed on Jan. 27, 2006. The contents of these applications are incorporated herein by reference in their entirety.

BACKGROUND OF THE INVENTION

1. Field of the Invention

The present invention relates to a substrate and a multilayer circuit board.

2. Discussion of the Background

In recent years, high density packages (multi-chip packages) having a structure in which a plurality of insulating substrates with built-in LSI chips and/or memories are laminated have been used for mounting high density packaging of electronic components.

Such an insulating substrate has conductive material provided in penetration holes formed in the thickness direction thereof, and through-holes of which electrically connecting the top surface side and the back surface side of the circuit board are formed of the conductive material.

Such insulating substrate is described in, for example, Japanese Patent Application Laid-open No. 2003-218282. The contents of Japanese Patent Application Laid-open No. 2003-218282 are incorporated herein by reference in their entirety

SUMMARY OF THE INVENTION

According to one aspect of the present invention, a substrate includes an inorganic material base board, a semiconductor device, resin filling, an insulating layer, and conductive wiring. The inorganic material base board has a recess and at least one penetration hole provided around the recess. The semiconductor device is accommodated in the recess and includes at least one electrode pad provided on a surface of the semiconductor device. The resin filling is provided in the at least one penetration hole and has at least one through-hole for electrically connecting a top surface and a back surface of the resin filling. The insulating layer covers the surface of the semiconductor device, a surface of the resin filling, and a surface of the inorganic material base board and has a first opening corresponding to the at least one through-hole and a second opening corresponding to the at least one electrode pad. The conductive wiring is formed on a surface of the insulating layer for electrically connecting the at least one through-hole and the at least one electrode pad.

According to another aspect of the present invention, a multilayer circuit board includes a plurality of substrates, and at least one bonding layer each provided between the plurality of substrates to bond the plurality of substrates. Each of the plurality of substrates includes an inorganic material base board, a semiconductor device, resin filling, an insulating layer, and conductive wiring. The inorganic material base board has a recess and at least one penetration hole provided around the recess. The semiconductor device is accommodated in the recess and includes at least one electrode pad provided on a surface of the semiconductor device. The resin filling is provided in the at least one penetration hole and has at least one through-hole for electrically connecting a top surface and a back surface of the resin filling. The insulating layer covers the surface of the semiconductor device, a surface of the resin filling, and a surface of the inorganic material base board and has a first opening corresponding to the at least one through-hole and a second opening corresponding to the at least one electrode pad. The conductive wiring is formed on a surface of the insulating layer for electrically connecting the at least one through-hole and the at least one electrode pad.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1A:
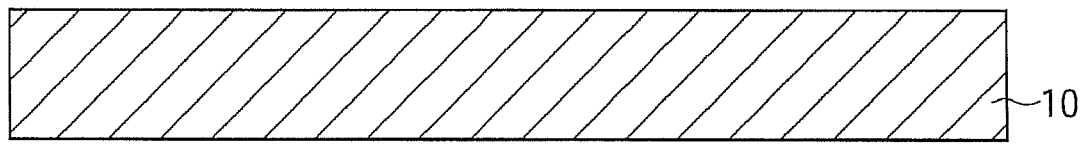
FIGS. 1A to 1E are manufacturing process diagrams (1) of the substrate with a built-in semiconductor device of the first embodiment of the present invention.

The embodiments will now be described with reference to the accompanying drawings, wherein like reference numerals designate corresponding or identical elements throughout the various drawings.

In order to miniaturize the high density packages smaller, the diameters of the through-holes need to be reduced. The embodiments of the present invention provide a substrate with a built-in semiconductor device suitable for miniaturization of through-holes having very small diameter can be made in high density with high accuracy, and a semiconductor device built-in type multilayer circuit board formed by laminating the substrates with a built-in semiconductor device.

Furthermore, as an inorganic material for a substrate having built-in semiconductor device, by using inorganic material having small thermal expansion difference compared to the built-in semiconductor device, electric connection of the electric components of the semiconductor device or the like can be shorten and wired securely with high density. Thus, the embodiments of the present invention provide a semiconductor device built-in type multilayer circuit board of which allows high density mounting and high speed operation.

An embodiment of the present invention is a substrate with a built-in semiconductor device includes an inorganic material base board in which a recess for accommodating a semiconductor device and penetration hole around the recess is formed; the semiconductor device accommodated in the recess; penetration hole filling resin which is filled in the penetration holes, and in which through-hole for electrically connecting the top surface and back surface of the substrate is formed; an insulating layer which covers the surface of the semiconductor device, the penetration hole filling resin, and the inorganic material base board, and the insulating layer has openings at a position corresponding to the through-hole and electrode pad on the surface of the semiconductor device; and conductor wirings formed on the surface of the insulating layer for electrically connecting the through-hole and the electrode pad of the semiconductor device.

Furthermore, an embodiment of the present invention is a substrate with a built-in semiconductor device, wherein the difference between the coefficient of thermal expansion of the inorganic material base board and that of the semiconductor device in the temperature range of 20° C. to 300° C. is $1 \times 10^{-5}$/K or less.

Furthermore, an embodiment of the present invention is a substrate with a built-in semiconductor device, wherein the inorganic material base board is made of at least one kind of nitride ceramics, oxide ceramics, carbide ceramics, low-temperature cofired ceramics (LTCC), graphite, and metal silicon.

Furthermore, an embodiment of the present invention is a substrate with a built-in semiconductor device, wherein the thickness of the inorganic material base board under the bottom face of the recess is between 10 μm and 250 μm.

Furthermore, an embodiment of the present invention is a semiconductor device built-in type multilayer circuit board including: a plurality of substrates with a built-in semiconductor devices, each including: an inorganic material base board in which a recess for accommodating a semiconductor device and penetration hole around the recess is formed; the semiconductor device accommodated in the recess; penetration hole filling resin which is filled in the penetration hole, and in which through-hole for electrically connecting the top surface and back surface of the penetration hole is formed; an insulating layer which covers the surfaces of the semiconductor device, the penetration hole filling resin, and the inorganic material base board, and the insulating layer has openings at positions corresponding to the through-holes and electrode pads on the surface of the semiconductor device; and conducive wirings formed on the surface of the insulating layer which electrically connect the through-holes and the electrode pads of the semiconductor device; and bonding layers laminating the plurality of substrates with a built-in semiconductor devices.

Furthermore, an embodiment of the present invention is a semiconductor device built-in type multilayer circuit board, wherein the substrates with a built-in semiconductor device adjacent to each other are electrically connected to each other through conductive bumps.

In the substrate with a built-in semiconductor device and the semiconductor device built-in type multilayer circuit board according to an embodiment of the present invention, through holes electrically connecting the top surface side(s) and the back surface side(s) of the substrate(s) with a built-in semiconductor device are formed in the insulating resin so that through-holes having vary small diameter can be formed in high density with high accuracy as compared with the case where through-holes are formed in the inorganic material base board(s) itself(themselves).

One of preferred embodiments of the semiconductor devices built-in type multilayer circuit board of the present invention will be further described below. This board is formed by laminating and integrating a plurality of substrates with built-in semiconductor devices having about the same structures in which semiconductor devices such as IC chips and the like are embedded in recesses provided in inorganic material base boards.

Furthermore, the semiconductor devices are in close contact with and bonded to the recesses of the inorganic material base boards so that heat generated from the semiconductor devices can be effectively dissipated through the inorganic material base boards. Since the semiconductor devices are embedded in the recesses and the substrates are laminated and integrated, electrical connections among the substrates with built-in semiconductor devices, especially among electronic components such as semiconductor devices can be made in a short time with reliability and short wirings, and also, high density packaging of semiconductor devices and miniaturization and operating speed increase of the board can be made possible.

Since inorganic material having a coefficient of thermal expansion little different from those of the built-in semiconductors is used, any large size difference is not caused between the semiconductor device and the inorganic material base board in the operating temperature range of the substrate with built-in semiconductor device. Thus, the adhesion force between the semiconductor device and the inorganic material base board is not reduced and the stability of the semiconductor device in the recess does not deteriorate so that the quality of the multilayer circuit board formed by laminating the substrates with built-in semiconductor devices is improved.

A characteristic configuration according to the embodiment of the present invention is that at least one penetration hole is formed around the recess for accommodating semiconductor device of the inorganic material base boards constituting the substrates with built-in semiconductor devices and penetration hole is filled with insulating resin in which through-holes for electrical connecting between the top surface side and the back surface side of the substrate with built-in semiconductor device are formed.

According to such a configuration, through-holes having very small diameter can be made in high density with high accuracy and the multilayer circuit board can be thus miniaturized as compared with the case where through-holes are made in the inorganic material base board.

As the insulating resin, for example, epoxy resin, polyimide resin, or the like can be used, and it is desirable that the wall surfaces of the penetration holes are made rough, the area of contact between the wall surfaces and the insulating resin is increased, and/or the insulating resin having small difference of a coefficient of thermal expansion compared to that of the inorganic material base boards is used in order to prevent the insulating resin falling off from the wall surfaces.

Another characteristic configuration according to the embodiment of the present invention is that the substrate with built-in semiconductor device are used in which differences in coefficient of thermal expansion between the semiconductor device and the inorganic material base board in the temperature range from 20° C. to 300° C. is less than $10^{-5}$/K (10 ppmK$^{-1}$).

According to such a configuration, the adhesive force between the semiconductor device accommodated in the recess and the inorganic material base board is not reduced and the stability of the semiconductor device in the recess is not deteriorated.

Furthermore, not only problems of stress concentration and warping of the substrate caused by the difference in coefficient of thermal expansion at the time of device operation can be solved, but also problems of stress concentration and warping of the substrate at the time of the manufacturing process can be mitigated.

Furthermore, any stress is not applied to the semiconductor device, so that no crystal defect arises in the device and thus the device characteristic does not deteriorate.

Since the raw material of the inorganic material base boards is made of various kinds of inorganic materials having a better thermal conductivity than that of resin or the like, so that heat generated by the semiconductor device is effectively diffused and dissipated. Thus, stress concentration and warping of the substrates at the time of operation of semiconductor devices can be effectively prevented and therefore a stable device operation can be ensured.

In a specific example, for example, when silicon material having the coefficient of thermal expansion of about $4.6 \times 10^{-6}$/K is used for the semiconductor device and aluminum oxide having the coefficient of thermal expansion of about $8.0 \times 10^{-6}$/K is used for the inorganic material base boards, the difference between them is about $3.4 \times 10^{-6}$/K, which is less than $1 \times 10^{-5}$/K of the preferable range according to the embodiment of the present invention.

When the thickness of each of the inorganic material substrates used for the multilayer circuit board is between 50 μm and 1000 μm, it is easy to handle the inorganic material substrate from a strength viewpoint, and it is also easy to form a recess for accommodating semiconductor device and penetration holes for forming through-holes electrically connecting the top surface side and the back surface side of the inorganic material base board.

In addition, it is easy to fill resin into the penetration holes, and it is also easy to form penetration holes for forming through-holes for electrically connecting the top surface side and the back surface side of the resin.

The thickness of the resin is preferably between 100 μm and 800 μm, and more preferably about 200 μm or more, and 500 μm or less.

Each of the inorganic material base boards is provided with a recess for accommodating semiconductor device to form a substrate with built-in semiconductor device. The recess is provided one or more number according to the sizes of the semiconductor device to be accommodated therein. When the thickness of the substrate (inorganic material base board) under the bottom face of the recess is between 10 μm and 250 μm, heat generated by the semiconductor device is extremely efficiently dissipated and transferred to the surroundings, and the substrate can be reduced in thickness and size so that the embodiment of the present invention is preferable for miniaturization.

The inorganic material base board used for the embodiment of the present invention has insulating characteristic. For raw material of an inorganic material base board, inorganic material composed of at least one kind selected from the group consisting of oxide ceramics, carbide ceramics, low-temperature cofired ceramics (LTCC), graphite, and metal silicon is preferably used. Any of these materials has a large thermal conductivity and a good heat dissipation characteristic as compared with a resin material. When individual semiconductor devices are accommodated in the recess of an inorganic material base board to be in close contact with the recess, it is appropriate for dissipating heat generated from the semiconductor device to the whole of the substrate through the inorganic material base board in order to release to the outside of the substrate, and contributes to reduction of the operating temperatures of the semiconductor device and stabilization of the characteristics of the semiconductor device.

An inorganic material base board having a recess for accommodating semiconductor device is desired to be formed by bonding a frame plate having an opening and a flat plate each other, cutting one side of the flat plate, or using a ceramics sintered object made by firing a mold having a recess previously formed.

For semiconductor device, silicon material (coefficient of thermal expansion=$4.6 \times 10^{-6}$/K) and various kinds of compound semiconductor materials may be used. As compound semiconductor material other than silicon material, gallium arsenide compound material ($6.4 \times 10^{-6}$/K), gallium phosphide material ($5.3 \times 10^{-6}$/K), gallium nitride compound material ($5.6 \times 10^{-6}$/K), silicon carbide material ($4.7 \times 10^{-6}$/K), or the like may be used.

Around a recess for accommodating semiconductor device of an inorganic material base board constituting each of substrates with built-in semiconductor devices constituting a multilayer circuit board, penetration holes are formed and filled with resin. In the resin, through-holes for electrically connecting the top surface side and the back surface side of the substrate are provided. An insulating layer which covers the semiconductor device and the inorganic material base board and has openings provided at positions corresponding to the through-holes and electrode pads, and conductive wirings which are formed along the surface of the insulating layer and electrically connect the through-holes to the electrode pads are provided.

When two or more substrates with built-in semiconductor devices are laminated to be integrated, the laminated substrates with built-in semiconductor devices are electrically connected to each other by conductive bumps.

The configuration of a substrate with built-in semiconductor devices will be described in more detail below.

An inorganic material base board has a recess as described above formed, for example, in about the midsection, that is, a region for accommodating semiconductor device. In the periphery outside the region for accommodating semiconductor devices, penetration holes are provided. The penetration holes are filled with resin, in which through-holes made of conductive material are formed.

The through-holes are electrically connected to the semiconductor device by conductive wirings formed between electrode pads formed on the semiconductor device and the through-holes. The conductive wirings are formed along the surface of the insulating layer which covers the semiconductor device and the surface of the inorganic material base board and has openings provided in positions corresponding to the through-holes and the electrode pads, and electrically connect the through-holes to the electrode pads. By the conductive wirings, electrical connection in the substrate with built-in semiconductor device is performed.

On the other hand, electrical connection between laminated substrates with built-in semiconductor device s is established through the through-holes provided in the substrates, especially through the conductive bumps. The laminated substrates are brought into direct contact to each other in order to provide electrical connection and form a multilayer circuit board.

In other words, such a substrate with built-in semiconductor device is laminated to the other substrates with built-in semiconductor devices having about the same configuration and integrated through adhesive as necessary to be a multilayer circuit board having high-density and high-functionality.

In a laminated and integrated multilayer circuit board, semiconductor device of a substrate with built-in semiconductor device which is connected to the outside through another substrate with built-in semiconductor devices is connected to conductive wirings and corresponding through-holes, and are connected to pads formed in correspondence with through-holes or conductive wirings of overlaid another substrate with built-in semiconductor device through conductive bumps, so that the distances between semiconductor chips can be reduced and the malfunctions caused by resistances of wirings and/or inductances of wirings can be reduced. As a result, an electric signal can be transmitted fast without delay.

When the diameter of the through-hole is approximately between 50 μm and 500 μm, it is easy to fill conductive material into the through-hole, high connection reliability can be obtained, and high-density packaging is also easy.

The through-holes are formed by inserting a W—Mo plug into a penetration hole previously formed in resin or by plating the penetration hole with conductive material. The plating may be either electrolytic plating or electroless plating, and electrolytic plating is more preferable.

For the electrolytic plating, for example, Sn, Pb, Ag, Au, Cu, Zn, In, Bi, solder, tin alloy, or the like is used, and in particular Cu is preferably used.

Instead of by plating treatment, each of the through-holes may be formed by filling conductive paste into a penetration hole, or by forming a plated film on a part of a penetration hole by electrolytic plating or electroless plating and filling conductive paste into the rest of the penetration hole.

As the conductive paste, conductive paste made of one or more kinds of metal particles selected from silver, copper, gold, nickel, and various kinds of solder may be used.

Furthermore, metal particles having different kind metal coated on the surfaces of them may also be used. Specifically, copper particles having noble metal (such as, gold or silver) coated on the surfaces thereof may be used.

As the conductive paste, organic conductive paste in which thermosetting resin such as epoxy resin or polyphenylene sulfide (PPS) is added to metal particles is preferable.

It is desirable that penetration holes for forming through-holes are formed by laser beam machining. Instead of laser beam machining, a mechanical method (such as, drilling, punching, or the like) may be used for making the holes.

The penetration hole is provided in the periphery outside the midsection of the inorganic material base board, while a recess for mounting semiconductor devices is formed in about the midsection of the inorganic material base board. The recess is provided in accordance with the sizes and thicknesses of the semiconductor devices, and it is desirable that the semiconductor devices are fixed to the recess by suitable adhesive as necessary after accommodated in the recess.

On the surfaces of the semiconductor device accommodated in the recess of the inorganic material base board, electrode pads are provided. It is desirable that the electrode pads are fixed on the surface of the semiconductor device in such a manner that the surfaces of the electrode pads are on about the same plane as the surface of the inorganic material base board, preferably on a level which is 10 μm or less different from the surface of the inorganic material base board. By keeping such a relationship, a wiring layer electrically connecting the electrode pads of the semiconductor device to the through-holes can be formed in a plane in order to increase the density of wiring circuits and reduce the distances between semiconductor devices, and also, in an insulating layer provided to cover the surface of the inorganic material base board and the surfaces of the semiconductor devices, the depths of openings provided at positions corresponding to the through-holes and the electrode pads can be constant. Thus, the exposure condition and the laser beam machining condition used when forming openings from the surface of the insulating layer to the through-holes and the electrode pads can be easily set.

It is desirable that the semiconductor device is fixed to at least the bottom of the recess of the inorganic material base board with, for example, adhesive (such as, epoxy silver paste), or to be bonded and fixed to the inner wall of the recess through eutectic alloy between the semiconductor device and the inner wall material of the inorganic material base board.

As the insulating layer provided to cover the surface of the inorganic material base board and the surfaces of the semiconductor device, a resin insulating layer is preferable, and thermosetting resin, thermoplastic resin, or complex of thermosetting resin and thermoplastic resin can be used.

It is desirable that the resin insulating layer is formed from a resin film softened under a predetermined heating condition, such as a resin film having the main ingredient of which is thermosetting polyolefin resin or epoxy resin.

Cycloolefin resin which is a kind of polyolefin resin may be used, because cycloolefin resin has a low dielectric constant and a low dielectric loss tangent so that when a high frequency signal in a GHz band is used, propagation delay and an error of the signal are hard to occur, and furthermore, cycloolefin is excellent in mechanical characteristic such as rigidity.

Conductive wirings for electrically connecting the electrode pads of the semiconductor device to the through-holes are provided on the surface of the insulating layer, and openings are formed in the insulating layer at the positions corresponding to the through-holes and the electrode pads. The through-holes are electrically connected with the electrode pads by the conductor wirings through the openings.

It is desirable that the openings are formed to have diameters corresponding to the sizes of the electrode pads and the through-holes. Furthermore, the openings are formed by exposing and developing when the insulating layer is made of photosensitive resin, and are formed by laser irradiation when the insulating layer is made of thermosetting resin or thermoplastic resin.

As the laser beam used at that time, carbon dioxide gas laser, ultraviolet laser, excimer laser, or the like is preferable.

After the openings have been formed, the surface of the insulating layer may be made rough as necessary to increase the adhesiveness to the conductive wirings formed on the insulating layer.

When the conductive wirings are formed by electroless plating, catalytic nucleus for electroless plating is applied to the surface of the insulating layer. Typical catalytic nucleuses are palladium-tin colloid. When the substrate is dipped in this solution, dried, and heat-treated, the catalytic nucleuses are fixed to the surface of the insulating layer.

Furthermore, metal nucleuses may be implanted into the surface of insulating layer by CVD, sputtering, or plasma to be catalytic nucleus. In this case, metal nucleuses are embedded in the surface of the insulating layer, and the plate is precipitated around the metal nucleuses to form conductive wirings, so that when resin having bad adhesiveness to the conductive wirings such as resin which is hard to be made rough or fluororesin (polytetrafluoro-ethylene or the like) is used, adhesiveness can be secured.

Such metal nucleus is desired to be of at least one kind of metal selected from palladium, silver, gold, platinum, titanium, copper, and nickel. The amount of the metal nucleuses is desired to be 20 µg/cm² or less. If the amount of the metal nucleuses is more than 20 µg/cm², metal nucleuses must be removed.

On the surfaces of the through-holes, the surfaces of the electrode pads of the semiconductor device, and the surface of the insulating layer, a thin conductive layer is formed from which the conductive wirings would be formed. The thin conductive layer is formed by sputtering or electroless plating, and copper sputtering or electroless copper plating is preferable, respectively.

On the thin conductive layer, a photosensitive dry film is laminated and then plating resist is formed by exposure and development processing. After that, electrolytic plating is applied to the thin conductive layer to make the conductive layer thick and plate the openings corresponding to the through-holes and the openings corresponding to the electrode pads of the semiconductor device.

The electrolytic plating is desired to be formed by electrolytic copper plating, and the thickness thereof is preferably between 5 µm and 30 µm. The plating resist is removed, and the thin conductive layer under the plating resist is dissolved and removed by etching treatment using any one of sulfuric acid hydrogen peroxide solution, persulfate solution such as ammonium persulfate solution, sodium persulfate solution, or potassium persulfate solution, ferric chloride solution, and cupric chloride solution as etchant to form conductive wirings for electrically connecting the electrode pads of the semiconductor device to the through-holes along the surface of the insulating layer.

The conductive wiring is constituted by patterns having a very narrow line width extended from the electrode pads of the semiconductor device fixed to about the midsection of the substrate to the periphery of the substrate, and the thicknesses of the conductive wirings are preferably between 5 µm and 30 µm and are more preferably 12 µm.

Furthermore, the ratio of the line width L to the distance D between lines (L/D) is preferably between 50 µm/50 µm and 100 µm/100 µm. In addition, apertures of pads formed on the wiring patterns are preferably between 150 µm and 500 µm, most preferably 350 µm.

The conductive bumps for electrically connecting the laminated substrates with built-in semiconductor devices to each other are desired to be formed by plating or printing conductive paste.

This filling by plating treatment can be performed by either electrolytic plating or electroless plating, and electrolytic plating is preferable. For the electrolytic plating, for example, Sn, Pb, Ag, Au, Cu, Zn, In, Bi, solder, tin alloy, or the like may be used. However, in this embodiment, electrolytic tin plating is most suitable.

When the heights of the conductive bumps are between 3 µm and 30 µm, variations in the heights of the bumps caused by deformation of the bumps can be allowed and occurrence of migrations and whiskers is not increased.

In particular, the height of about 5 µm is most desirable. Furthermore, the conductive bumps may also be formed by printing conductive paste on the through-holes by screen printing using a metal mask instead of plating.

The bumps made of the conductive paste are desired to be in a half-cured state, because the conductive paste is also hard in a half-cured state and is allowed to penetrate an organic adhesive layer softened at heat pressing, and the conductive paste is deformed and the contact area increases at the time of heat press so that the conductive resistance can be reduced and the variations in the heights of the bumps can be corrected.

In addition, the conductive bumps may be formed by a method of printing solder paste which is low-melting metal, a method of solder plating, or a method immersing into solder melting solution. As the low-melting metal, Pb—Sn solder, Ag—Sn solder, indium solder, or the like may be used.

It is desirable that an adhesive layer is formed on either surface of this substrate with built-in semiconductor device to bond this substrate to another substrate with built-in semiconductor device, and the adhesive layer is formed by applying the whole of either surface of this substrate with resin and drying so as to be uncured state.

It is desirable that a multilayer circuit board is formed in such a manner that a positioning mark previously provided on each of two or more substrates with built-in semiconductor devices is optically detected by a CCD camera or the like and the substrates are laminated in a predetermined direction while positioning them and integrated by, for example, a heat press.

The lamination of the substrates is proceeded while optically detecting the positioning marks previously provided on the substrates by a CCD camera or the like and positioning the substrates. Such laminated substrates are pressed with a pressure between 0.5 MPa and 5 MPa while heating them at a temperature between 50° C. and 250° C., so that all of circuit boards can be integrated by onetime pressing. In particular, a preferable heat temperature is in the range of 160° C. or more and 200° C. or less.

Electronic components other than semiconductor device may be mounted on the pads of conductive wirings of a circuit board in a surface of the multilayer circuit board.

In addition, conductive wirings including pads are formed on a circuit board in the outermost layer of the multilayer circuit board, a nickel-gold layer, for example is formed on the pads of the conductive wirings, and solder balls or pins are connected onto the gold-nickel layer to form connecting terminals for connection to a motherboard.

EMBODIMENTS

A substrate with a built-in semiconductor device and a semiconductor devices built-in type multilayer circuit board according to the embodiment of the present invention will be concretely described below. In the following embodiments, four substrates with a built-in semiconductor devices are laminated one by one to be multi-layered in four layers to make a semiconductor device built-in type multilayer circuit board. However, the present invention is not limited to this. According to the characteristics, capacities, thicknesses, and the like of mounted semiconductor devices or kinds, thicknesses, and the like of inorganic material base boards, three or less or five or more substrates with a built-in semiconductor device may be laminated to make a semiconductor devices built-in type multilayer circuit board.

First Embodiment

A substrate with a built-in semiconductor device and a semiconductor devices built-in type multilayer circuit board according to the embodiment of the present invention are manufactured according to the following process of (1) to (17).

FIGS. 1A to 1E, FIGS. 2A to 2D, FIGS. 3A to 3D, and FIGS. 4A to 4B are cross-sectional views illustrating the manufacturing process.

(1) A green sheet 10 having inorganic solid content which is mixture of low-melting glass and alumina is obtained by using doctor blade method (see FIG. 1A).

Figure 1B:
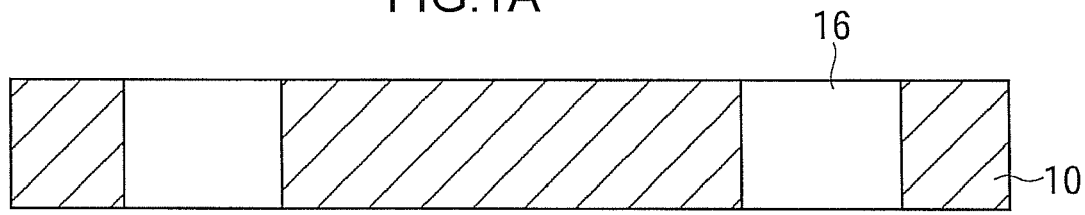

(2) The green sheet 10 is dried for five hours at 80° C., and is then punched to make one or more penetration holes 16 as shown in FIG. 1B.

Figure 6:
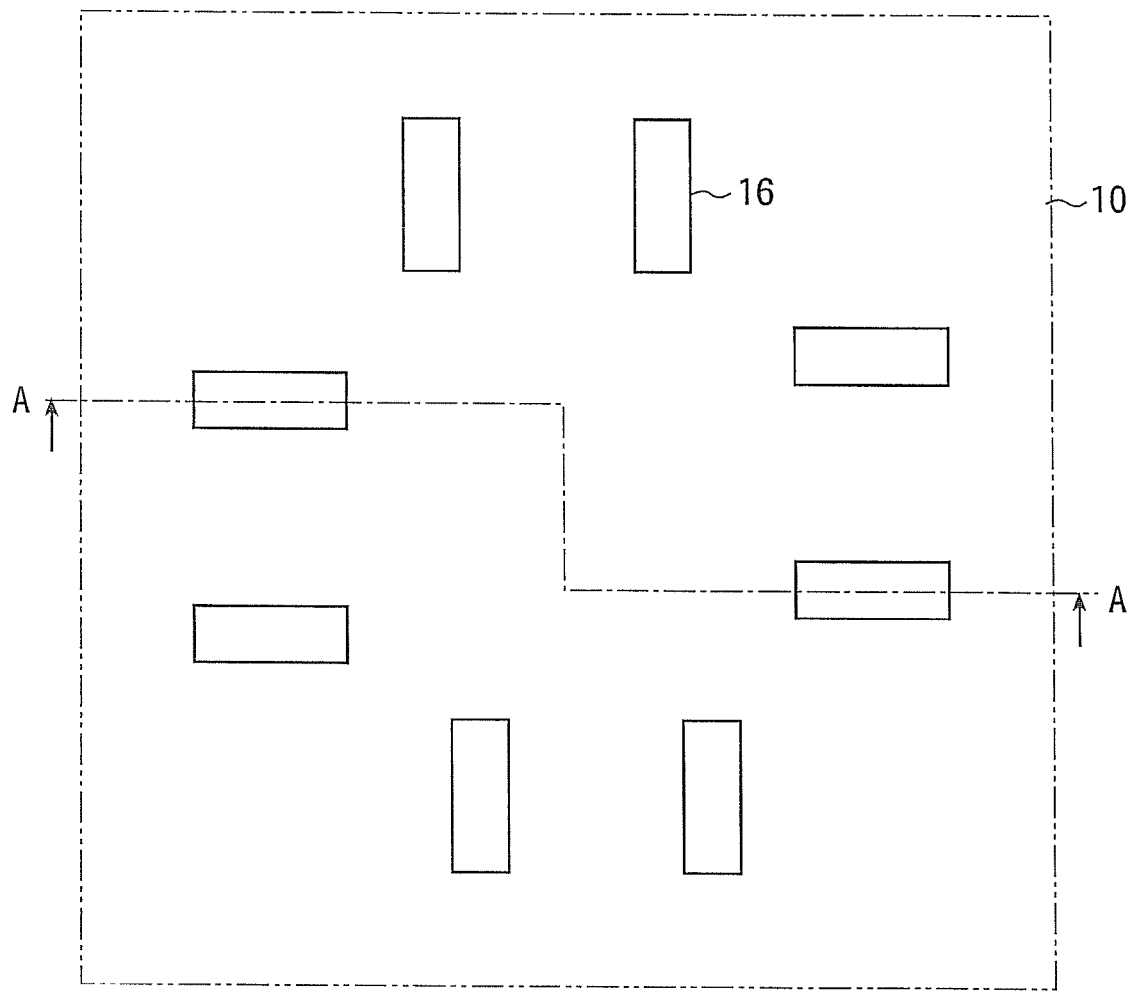
FIG. 6 is a plan view showing a part of the region of a green sheet.

A plan view of a region of the green sheet 10 in this region is shown in FIG. 6. Plural of regions shown with an alternate long and two short dashes line in FIG. 6 are provided in the green sheet 10. The alternate long and two short dashes line denotes a boundary where a region is separated from other regions in a dicing process described later. FIG. 1B is a cross-sectional view taken along the line A-A in FIG. 6.

The penetration holes 16 may be formed by laser beam machining, drilling, or the like instead of punching.

(3) Next, the green sheet 10 is degreased for five hours at 600° C. and is then heated and sintered for three hours at 850° C. to obtain an inorganic material base board having the thickness of 0.5 mm. When the coefficient of thermal expansion in the range of 20° C. to 300° C. of the obtained inorganic material base board is measured, $5.5 \times 10^{-6}$/K is obtained.

Figure 1C:

(4) Next, resin such as epoxy resin is filled into the penetration holes 16 and the surface of the resin is polished and smoothed to form penetration hole filling resin 17 (FIG. 1C).

The reference numeral 11 in FIG. 1C and undermentioned figures denotes an inorganic material base board made of sintered inorganic material.

Figure 1D:
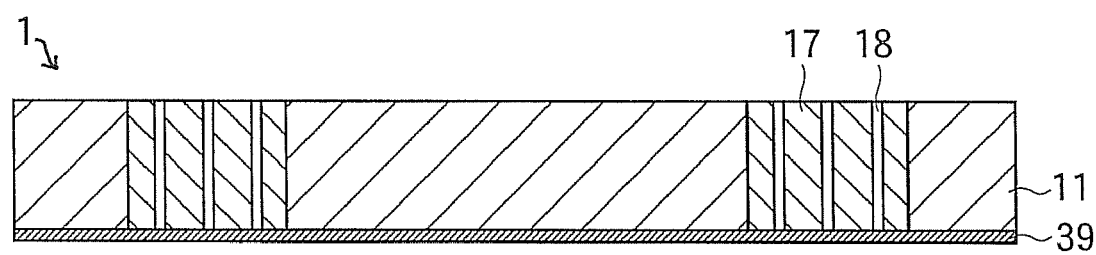
Figure 1E:
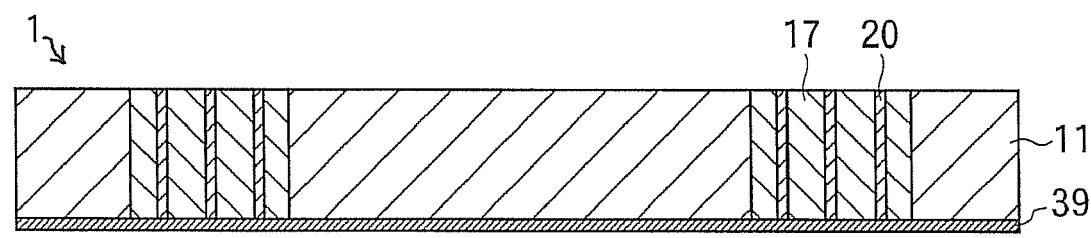
Figure 7:
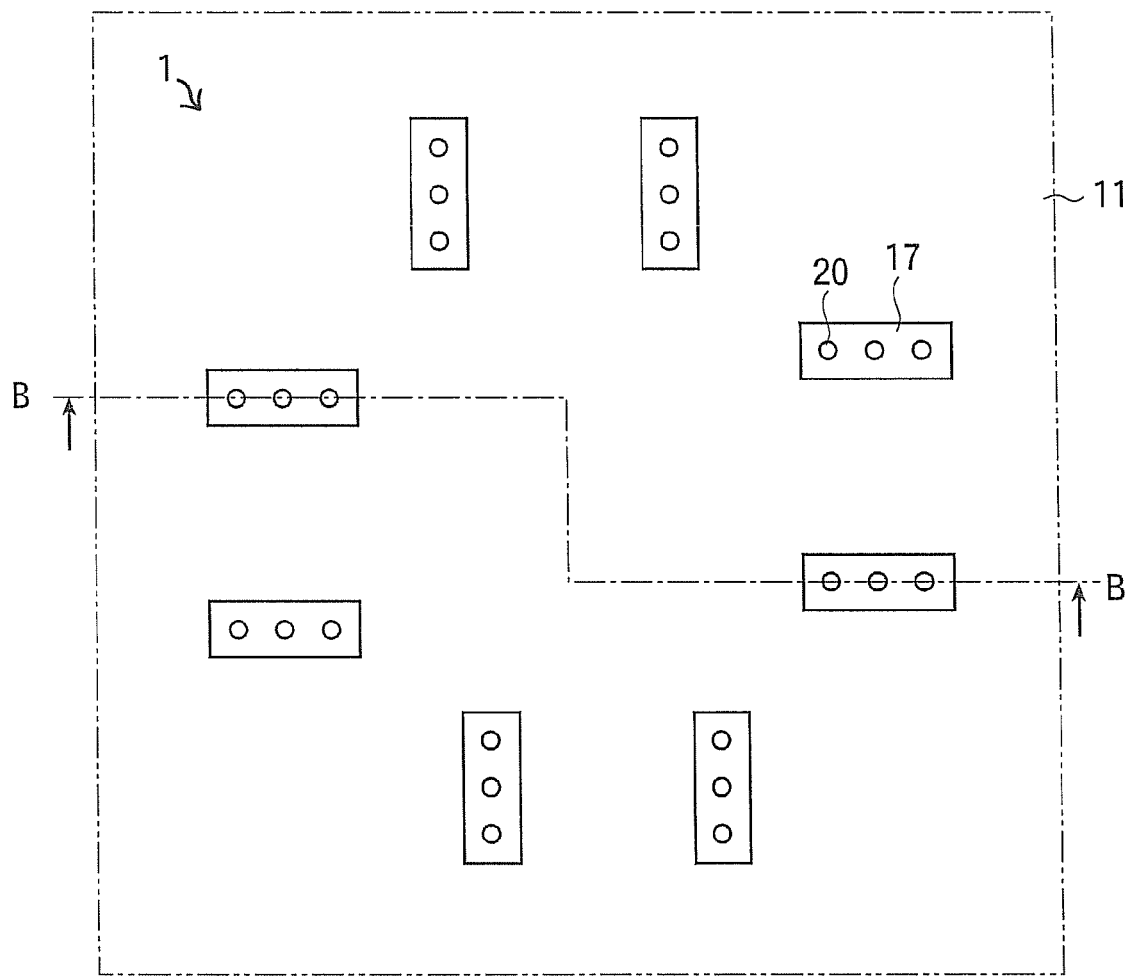
FIG. 7 is a plan view showing the state that through-holes are formed.

(5) Next, a copper foil 39 having the thickness of 10 μm is adhered on one of a surface of the inorganic material base board 11, and penetration holes 18 for forming through-holes having the diameter of 200 μm are formed in the penetration hole filling resin 17 as shown in FIG. 1D by a carbon dioxide laser from a surface opposite to a surface on which the copper foil 39 has been adhered. Next, after plating resist has been applied to the copper foil 39, through-holes 20 are formed in the penetration holes 18 for forming through-holes as shown in FIG. 1E by copper plating, and then the plating resist is peeled off. A plan view of this state is shown in FIG. 7. FIG. 1E is a cross-sectional view taken along the line B-B in FIG. 7.

Figure 2A:
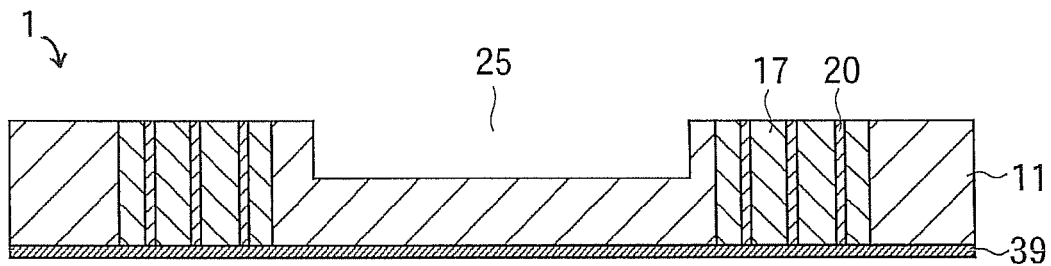
FIGS. 2A to 2D are manufacturing process diagrams (2) of the substrate with a built-in semiconductor device of the first embodiment of the present invention.

(6) Subsequently, a mask is placed on the inorganic material base board 11 obtained in (5), and then a recess 25 for accommodating a semiconductor device is formed as shown in FIG. 2A by sandblast treatment. Hereinafter, a surface on which the recess 25 has been formed of the inorganic material base board 11 is referred to as "a first surface".

Figure 8:
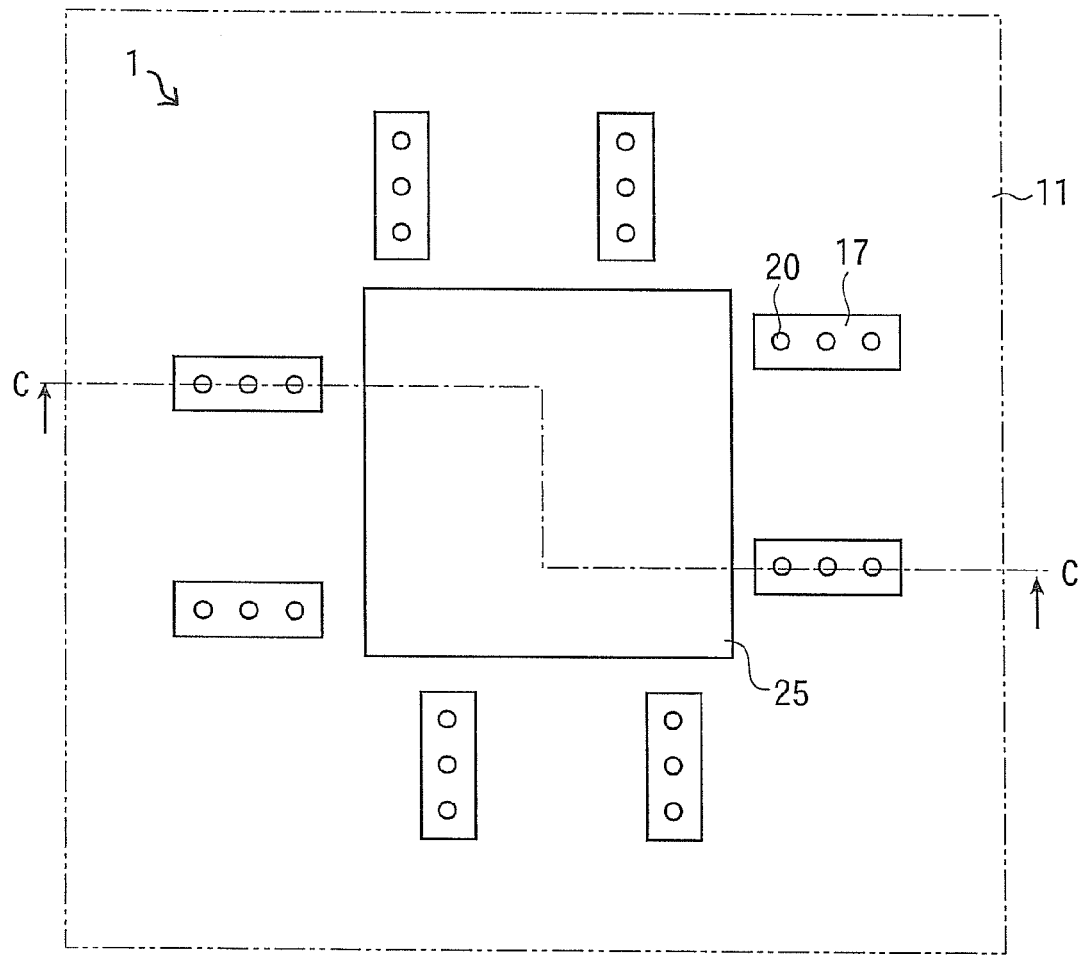
FIG. 8 is a plan view showing the state that a recess is formed.

A plan view of this state is shown in FIG. 8. FIG. 2A is a cross-sectional view taken along the line C-C in FIG. 8.

Figure 2B:
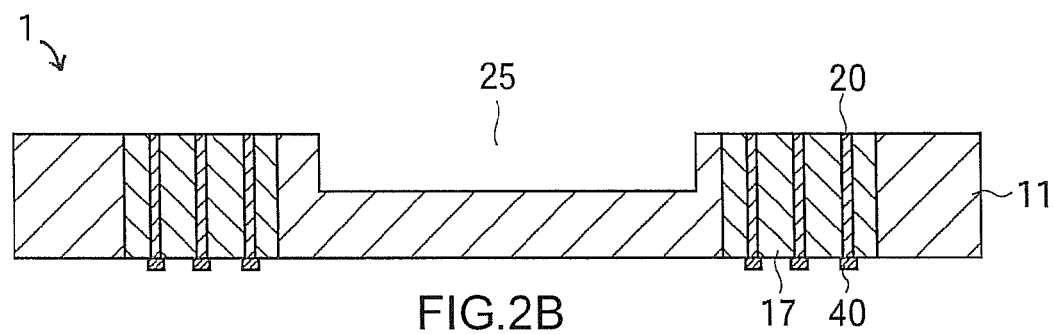

Next, a photosensitive dry film resist is applied to cover the copper foil, and then exposure, development, and patterning are performed to form an etching resist layer. Next, portions of the copper foil which are not covered with the etching resist layer are etched by cupric chloride etching solution to pattern the copper foil and through-hole pads 40 made of remained copper foil having the diameter of 300 μm on the through-holes 20 is formed. FIG. 2B shows the state after the etching resist layer has been removed.

Figure 9:
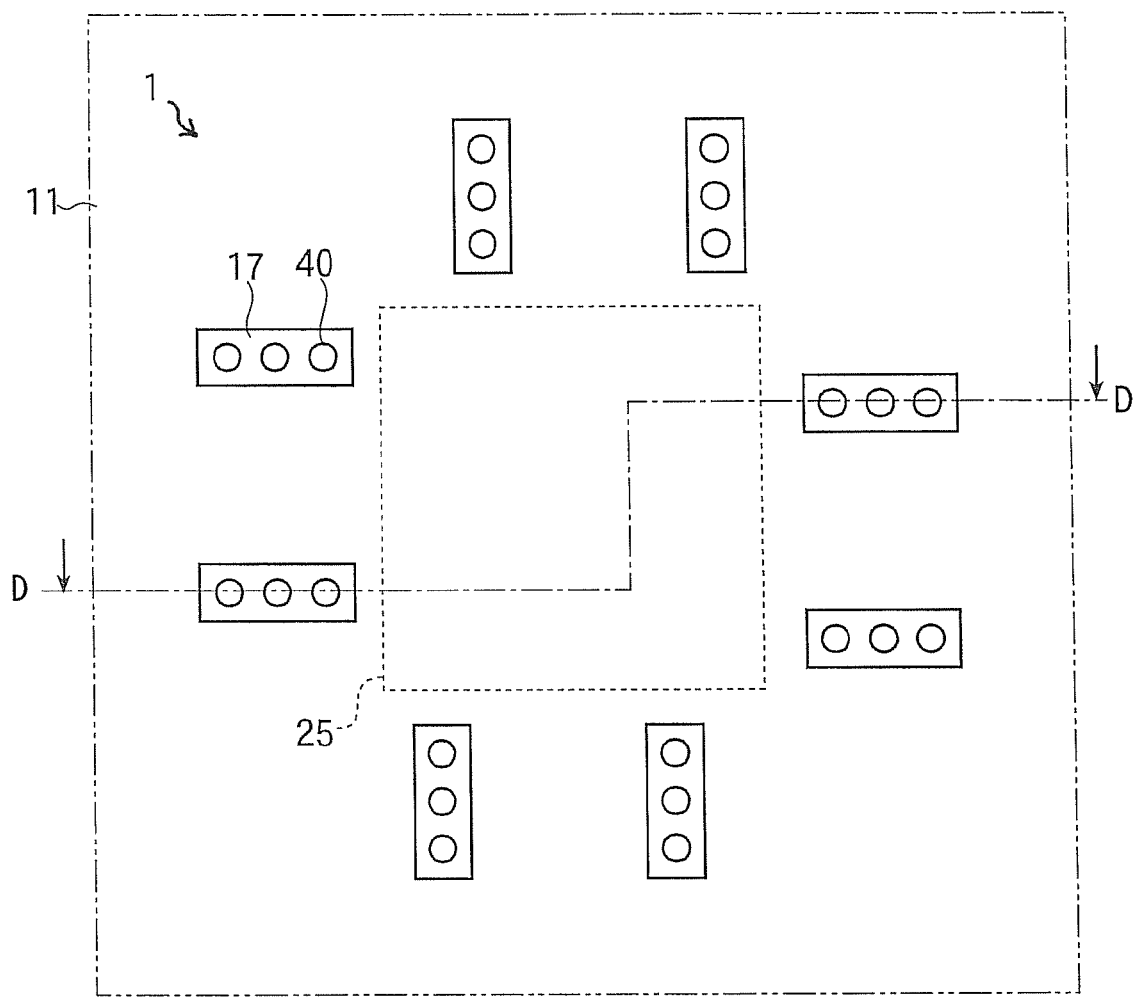
FIG. 9 is a plan view showing the back surface side in the state that through-hole pads are formed.

A plan view of the back surface of this state is shown in FIG. 9. FIG. 2B is a cross-sectional view taken along the line D-D in FIG. 9.

The through-hole pads 40 are desired to be formed in such a manner that the inner diameters of them are about the same as the through-hole apertures.

Figure 2C:
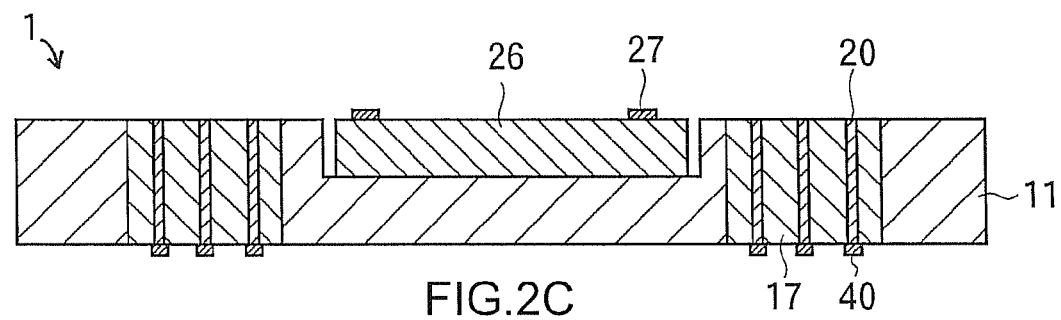

(7) Subsequently, adhesive (epoxy silver paste: SA-2024 made by Fujikura Kasei Co., Ltd.) is pasted to the inner wall and bottom face of the recess 25 obtained in (6), and then a semiconductor device 26 (silicon base material: coefficient of thermal expansion is $4.6 \times 10^{-6}$/K at 25 to 450° C.) shaped as a chip by dicing is set in the recess 25 as shown in FIG. 2C. After that, the semiconductor device 26 is heated for 15 minutes at 170° C. in an ambience of nitrogen in order to bond and fix the semiconductor device 26 to the inner wall of the recess 25 by to drying and curing the adhesive.

Figure 10:
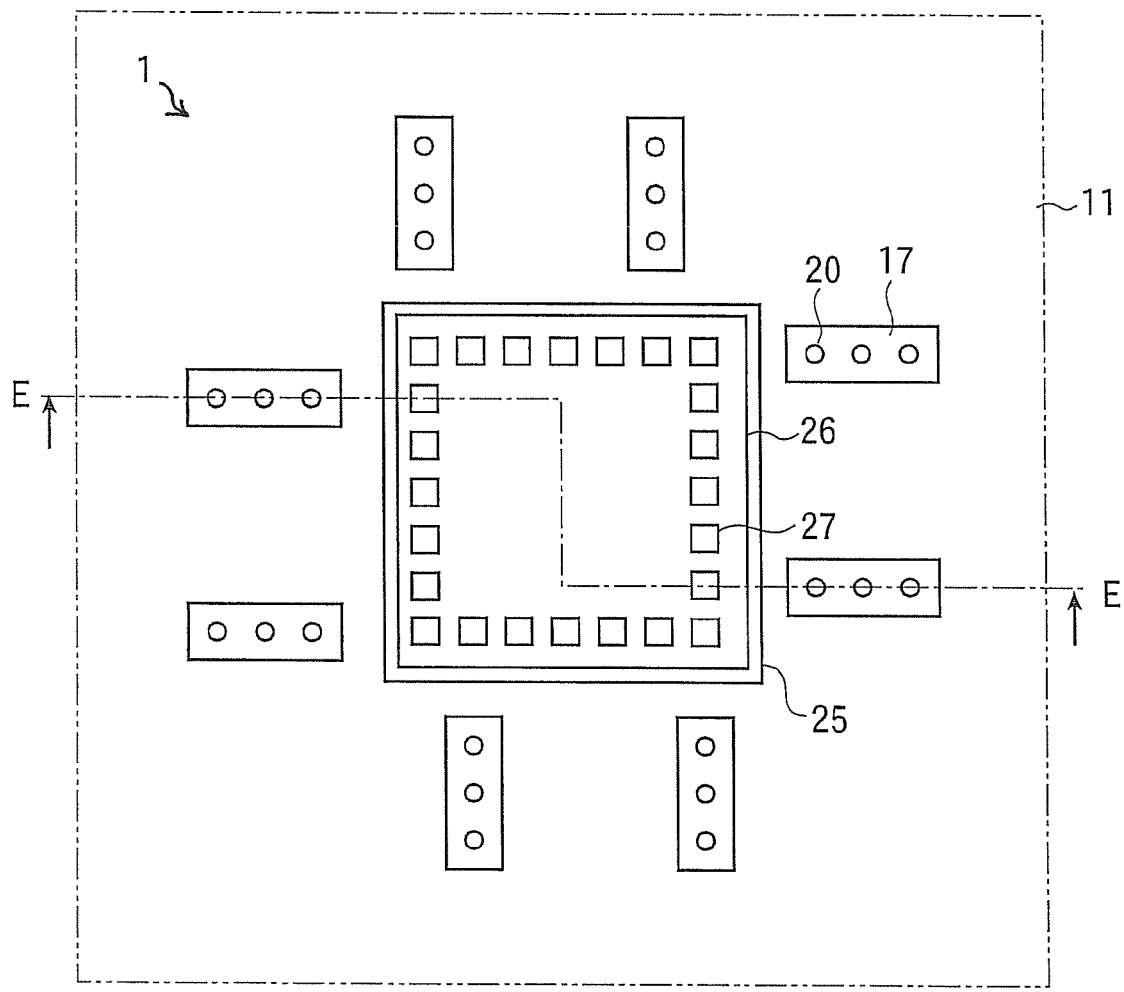
FIG. 10 is a plan view showing the state that a semiconductor device is mounted.

A plan view of this state is shown in FIG. 10. FIG. 2C is a cross-sectional view taken along the line E-E in FIG. 10.

It is desirable that the depth of the recess 25 is such that the surfaces of the electrode pads 27 are on the same plane as the surface of the inorganic material base board 1 when the semiconductor device 26 is fixed in the recess 25.

Bonding and fixing of the semiconductor device 26 to the recess 25 may be performed using Au—Si eutectic alloy. In this case, using a metal mask made of stainless steel having openings at portions located on the recess 25 as a mask, Au is evaporated onto the inner wall of the recess 25 in a thickness between 1 μm and 10 μm. Next, a semiconductor device 26 (silicon base material: coefficient of thermal expansion is $4.6 \times 10^{-6}$/K at 25 to 450° C.) shaped as a chip by dicing is set on the Au film. After that, the semiconductor device 26 is heated for 10 minutes at 400° C. in an ambience of nitrogen to form eutectic crystal of Au and Si between the Au film evaporated onto the inner wall of the recess 25, and thereby the semiconductor device 26 is bonded and fixed to the bottom face and inner wall of the recess 25.

Figure 2D:
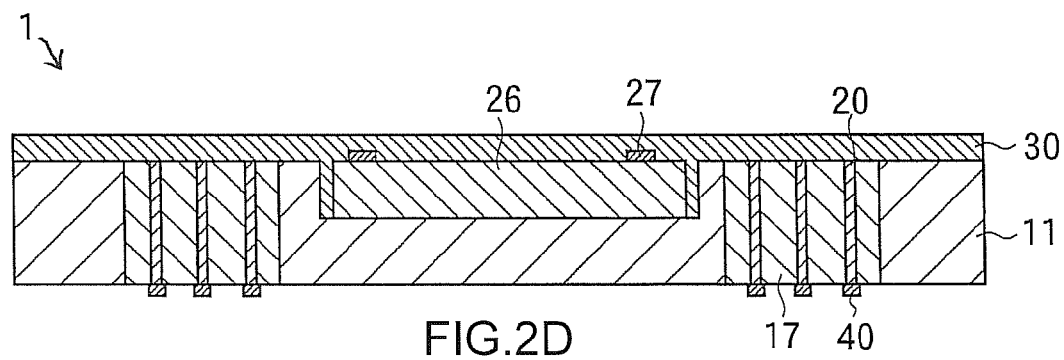

(8) Next, on the first surface of the inorganic material base board 11 in which the semiconductor device 26 is accommodated and fixed, a thermosetting polyolefin resin sheet having the thickness of 50 μm which is a resin film softened under a predetermined heating condition is heated and pressed to stack with the pressure of $9.8 \times 10^3$ Pa while increasing the temperature to 50° C. to 180° C. to provide a resin insulating layer 30 made of polyolefin resin as shown in FIG. 2D.

Figure 3A:
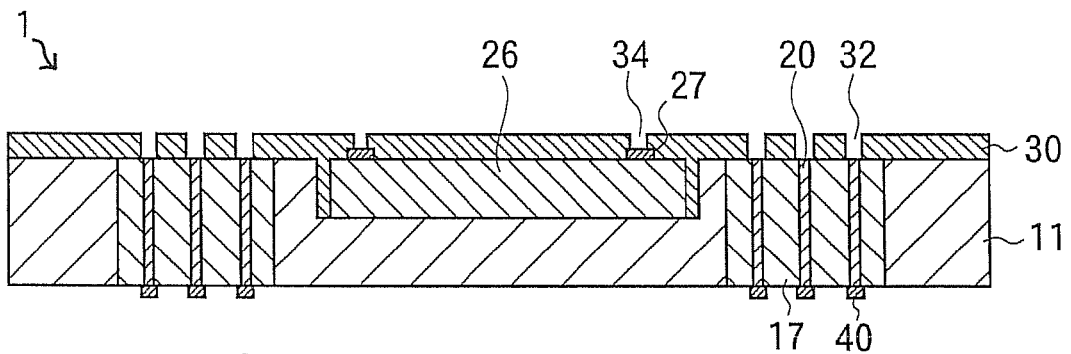
FIGS. 3A to 3D are manufacturing process diagrams (3) of the substrate with a built-in semiconductor device of the first embodiment of the present invention.

(9) The resin insulating layer 30 made of polyolefin resin is irradiated with laser light from the surface of it to provide opening 32 extending to the through-hole and opening 34 extending to the electrode pad 27 of the semiconductor device 26 as shown in FIG. 3A. To the bottom faces of the openings 32 and 34, the surface of the through-hole and the surface of the electrode pad 27 are exposed, respectively.

Desmear treatment and surface modification of polyolefin resin insulating layer 30 are performed by plasma treatment of $CF_4$ and oxygen mixed gas. By this modification, hydrophilic groups (such as, OH groups, carbonyl groups, COOH groups, and the like) are recognized.

(10) Next, sputtering using a target made of copper is performed to form a copper sputtering layer (not shown) having the thickness of 0.1 μm as a conductive primary layer on the surface of the resin insulating layer 30 made of polyolefin resin, the internal wall surface of the openings 32 and 34, the surface of the through-hole and the surfaces of the electrode pads 27 exposed on the bottom of the openings 32 and 34.

Figure 3B:
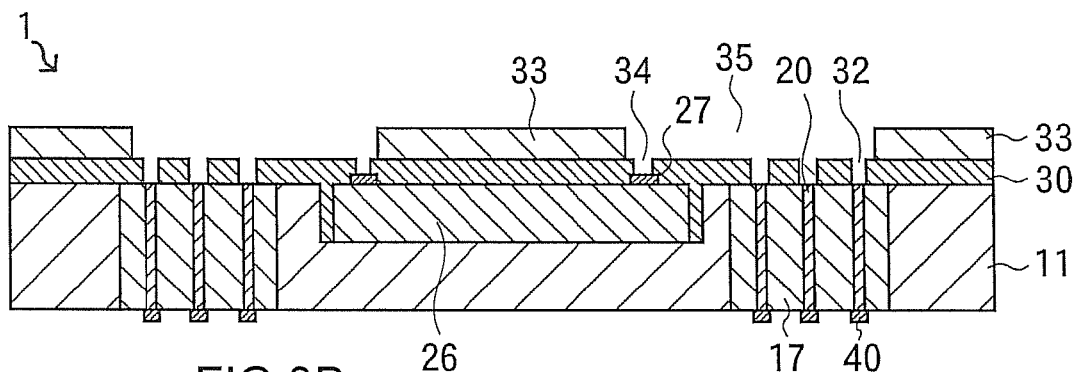

(11) Next, as shown in FIG. 3B, a plating resist layer 33 having the thickness of 15 μm with openings 35 having the same plane pattern as that of connecting wirings to be formed is provided on the copper sputtering layer using a photosensitive dry film.

Figure 3C:
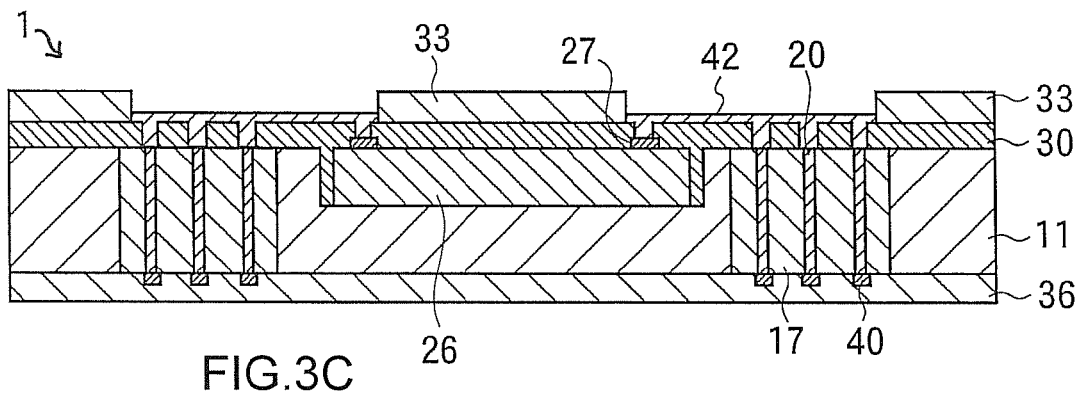

(12) A surface (referred to as "second surface" hereinafter) opposite to the first surface of the inorganic material base board is protected by another plating resist layer 36, and then, electrolytic copper plating is performed. An electrolytic copper plating layer having the thickness of 15 μm is grown on the surface of the conductive primary layer exposing to the bottom faces of the openings 35 of the plating resist layer 33 on the first surface, and connecting wiring pattern 42 of two-layer structure including the conductive primary layer and the electrolytic copper plating layer are formed (FIG. 3C). The openings 32 and 34 are filled with the electrolytic copper plating layer.

Figure 3D:
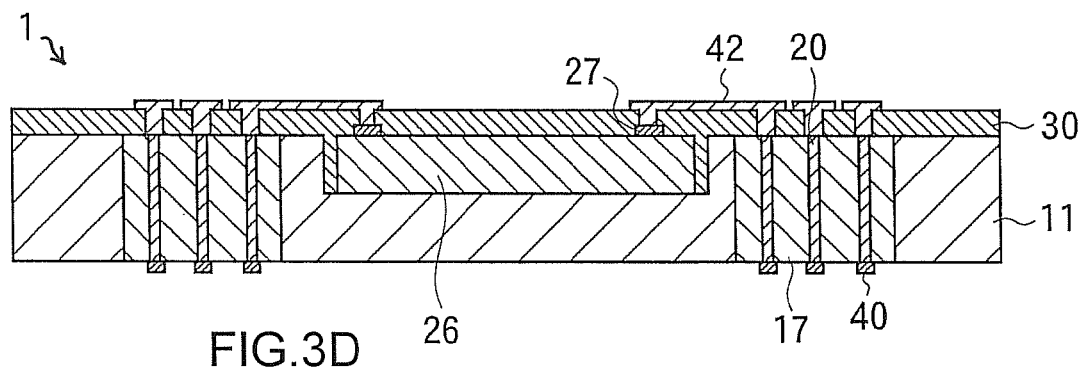

(13) Next, the plating resist layer 33 is removed, and then a copper sputtering layer (and the surface portion of the electrolytic copper plating layer) which has appeared on the first surface of the inorganic material base board 11, is dissolved and removed, and the connecting wiring pattern 42 made of the electrolytic copper plating layer and the copper sputtering layer is separated into plural patterns. Then, the plating resist layer 36 is peeled off (FIG. 3D).

Figure 11:
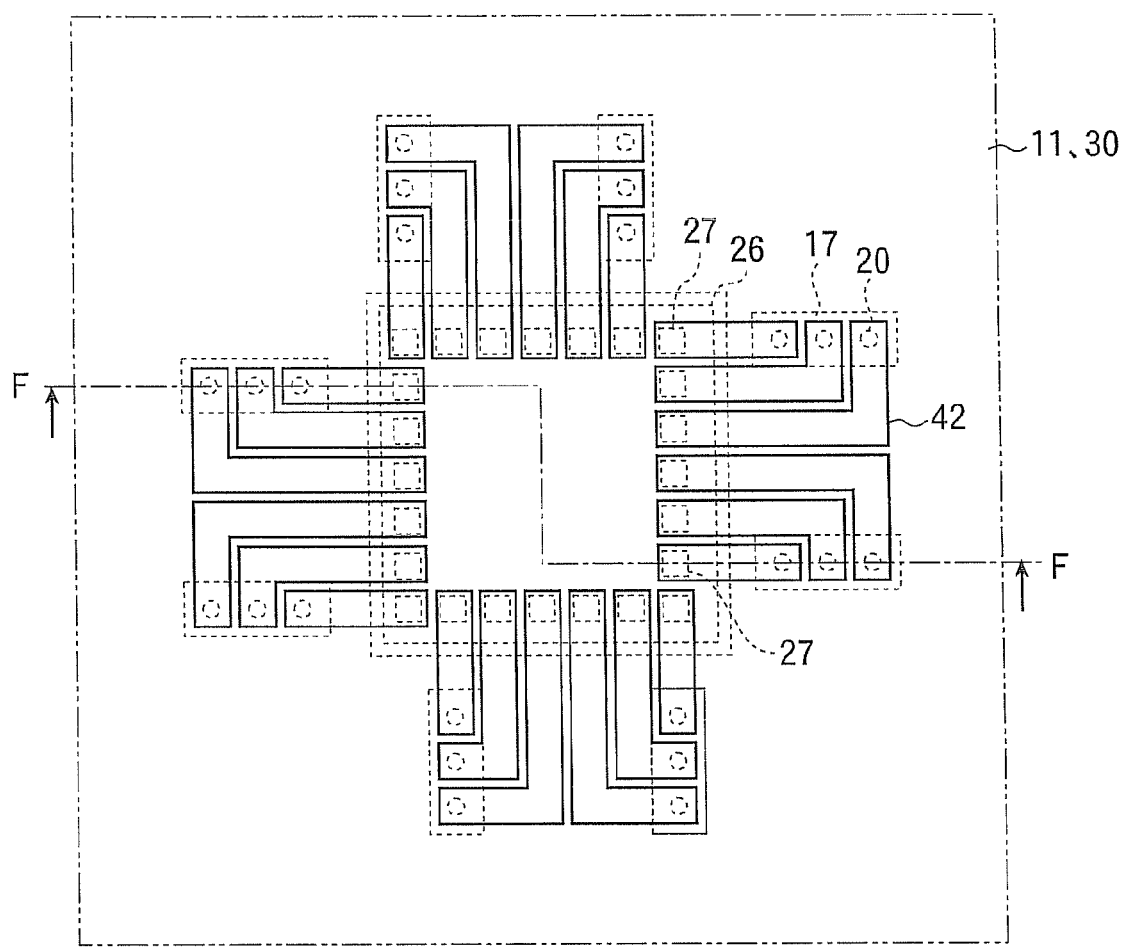
FIG. 11 is a plan view showing the state that wiring patterns are formed.

A plan view of this state is shown in FIG. 11. FIG. 3D is a cross-sectional view taken along the line F-F in FIG. 11.

Plural of the connecting wiring patterns 42 separated from each other are routed on the resin insulating layer 30 and are each in contact with a electrode pad 27 of the semiconductor device 26 at one end and in contact with a through-hole at the other end, and the electrode pads 27 of the semiconductor device 26 are thus electrically connected with the through-holes 20 through the connecting wiring patterns 42.

As a result, the substrate with built-in semiconductor device 12 according to the embodiment of the present invention is obtained.

Figure 4A:
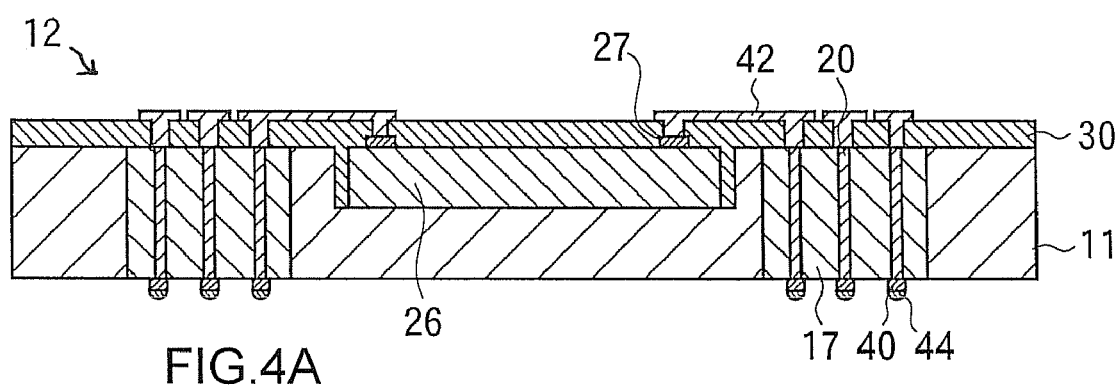
FIGS. 4A and 4E are manufacturing process diagrams (4) of the substrate with a built-in semiconductor device of the first embodiment of the present invention.

(14) Next, after a PET film is adhered on the first surface of the inorganic material base board 11, it is then dipped into electrolytic plating solution. A voltage is applied to the through-hole pads 40 to perform electrolytic tin plating in order to form conductive bumps 44 having the height of 5 μm on the through-hole pads 40 on the second surface as shown in FIG. 4A. FIG. 4A shows the state that the PET film has been peeled off.

Figure 4B:
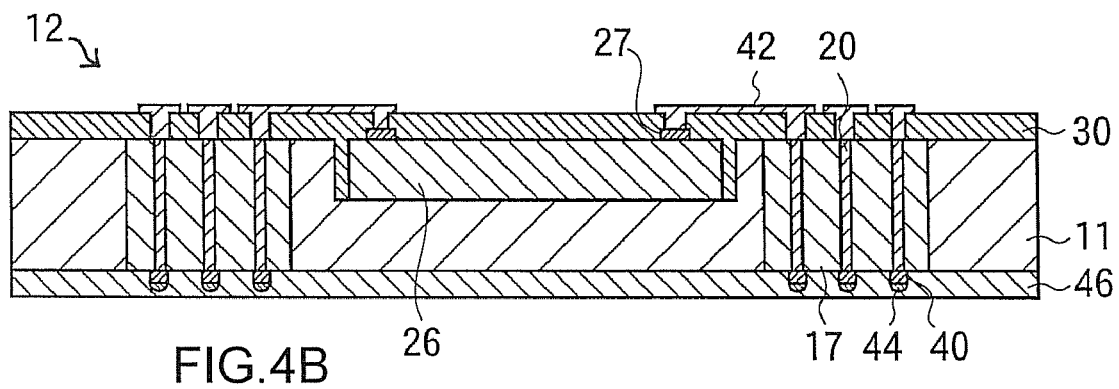
Figure 5:
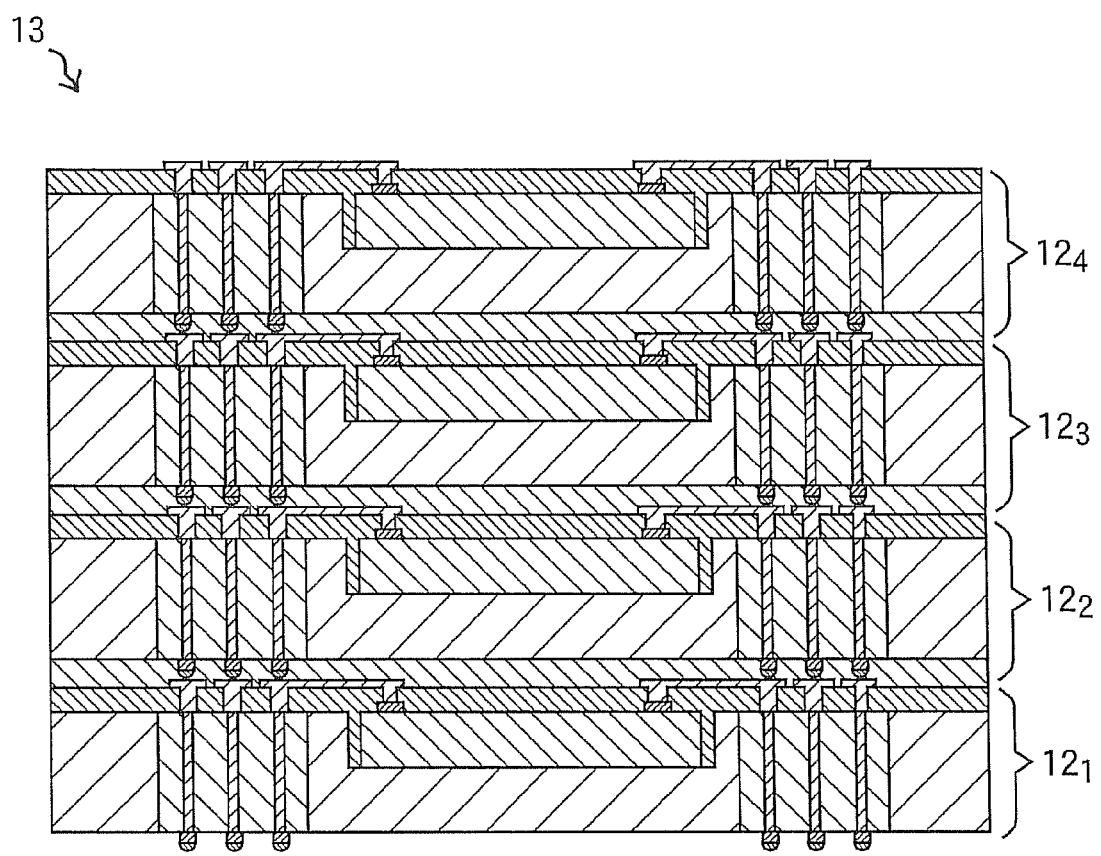
FIG. 5 illustrates a semiconductor device built-in type multilayer circuit board of the present invention.

(15) In addition, adhesive made of epoxy resin is coated on the second surface of the inorganic material base board 11 on which the conductive bumps 44 have been formed in (14) and the adhesive is dried to form an adhesive layer 46 as shown in FIG. 4B.

In this embodiment, the adhesive layer 46 has been formed on the second surface of the inorganic material base board 11 in advance before below-mentioned multi-layering is performed. However, in a stage that each of the substrates with built-in semiconductor devices 12 are manufactured and are then laminated into multi-layered, adhesive may be applied in suitable locations to form an adhesive layer made of uncured resin in a dry state.

(16) The substrate with built-in semiconductor device 12 formed in (15) are cut and separated to individual ones by a dicing saw to manufacture individual substrate with built-in semiconductor device 12.

(17) These separated four substrates with built-in semiconductor devices 121 to 124 are directed in the same direction and laminated, and then, they are heated at the temperature of 180° C. and pressed with the pressure of 2 MPa. In the state that the substrates with built-in semiconductor devices 12 are bonded to each other with the adhesive layers 46, the adhesive layers 46 are cured to strongly bond and integrate the substrate with built-in semiconductor devices 121 to 124. Thus, a semiconductor device built-in type multilayer circuit board 13 is obtained. As the heat press, a vacuum heat press is used.

It has been recognized that when each of the semiconductor devices 26 in the obtained semiconductor device built-in type multilayer circuit board 13 is driven in an average load condition, the temperature of the semiconductor devices 26 do not increase to the extent that any malfunction arises, and the semiconductor device 26 operates satisfactorily.

Second Embodiment

The second embodiment is similar to the first embodiment, but aluminum oxide shown in the following table 1 is used for the inorganic material base board to manufacture a semiconductor device built-in type multilayer circuit board.

TABLE 1

| | Inorganic material base board | | | | | | Semiconductor device | |
|---|---|---|---|---|---|---|---|---|
| No. | Kind | Purity % | Density cm$^3$ | Coefficient of thermal expansion × 10$^{-5}$/K | Thermal conductivity W/(m/K) | Board thickness mm | Kind | Coefficient of thermal expansion × 10$^{-5}$/K |
| Embodiment 1 | LTCC | — | 2.8 | 0.55 | 3 | 0.40 | silicon | 0.46 |
| 2 | Aluminum oxide | 99.5 | 3.9 | 0.80 | 35 | 0.40 | silicon | 0.46 |
| 3 | Aluminum oxide | 99.5 | 3.9 | 0.80 | 35 | 0.75 | silicon | 0.46 |
| 4 | Aluminum oxide | 99.5 | 3.9 | 0.80 | 35 | 0.27 | silicon | 0.46 |
| Comparative embodiment | Composite material of glass and epoxy resin | — | — | 15 (Surface direction) | 0.45 | 0.60 | silicon | 0.46 |

| No. | Difference in coefficient of thermal expansion between insulating base and semiconductor device × 10$^{-5}$/K | Depth of recess μm | Adhesive for device | Difference in level μm | Conductive bump | Through-hole |
|---|---|---|---|---|---|---|
| Embodiment 1 | 0.09 | 148 | Epoxy silver paste | 3.0 | Electrolytic Tin plating | Cu plating |
| 2 | 0.34 | 150 | Epoxy silver paste | 5.0 | Electrolytic Tin plating | Cu plating |
| 3 | 0.34 | 500 | Epoxy silver | 5.0 | Electrolytic | Cu |

TABLE 1-continued

| 4 | | | paste | | Tin plating | plating |
| | 0.34 | 20 | Epoxy silver | 5.0 | Electrolytic | Cu |
| Comparative | | | paste | | Tin plating | plating |
| embodiment | 14.5 | 450 | Epoxy silver | 5.0 | Electrolytic | Cu |
| | | | paste | | Tin plating | plating |

It has been recognized that when each of the semiconductor device in the obtained semiconductor device built-in type multilayer circuit board is driven in an average load condition same as in the case of the first embodiment, the temperature of the semiconductor devices do not increase as compared with the first embodiment and the semiconductor devices operates satisfactorily.

Third Embodiment and Fourth Embodiment

These embodiments are similar to the second embodiment, but the thickness of the inorganic material base board and the depth of the recess are changed to manufacture a semiconductor device built-in type multilayer circuit board.

It has been recognized in each of the embodiments that when each of the semiconductor devices in the obtained semiconductor device built-in type multilayer circuit board is driven in an average load condition, the semiconductor device operates satisfactorily.

Comparative Embodiment

When a semiconductor device built-in type multilayer circuit board manufactured using composite material of glass and epoxy resin having the coefficient of thermal expansion of $1.5 \times 10^{-6}$/K in the surface direction as the inorganic material base board is driven in the same condition as the first embodiment, it has been recognized that the devices are broken due to the thermal expansion gap.

Present Invention

The preferred embodiments of the present invention have been described. However, the present invention is not limited to these embodiments, and various changes and modifications can be made without departing from the spirit and scope of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A substrate comprising:
an inorganic material base board having a recess and at least one first penetration hole provided around the recess;
a semiconductor device accommodated in the recess and including at least one electrode pad provided on a surface of the semiconductor device;
resin filling provided in the at least one first penetration hole;
a plurality of second penetration holes formed in the resin filling in the at least one first penetration hole so as to penetrate the resin filling;
a plurality of through-holes including the plurality of second penetration holes and conductive material provided in the plurality of second penetration holes, and electrically connecting conductive wirings provided on a top surface and a back surface of the inorganic material base board; and
an insulating layer which covers the surface of the semiconductor device, a surface of the resin filling, and a surface of the inorganic material base board and which has a first opening corresponding to the plurality of through-holes and a second opening corresponding to the at least one electrode pad;
wherein the conductive wiring formed on a surface of the insulating layer for electrically connecting the plurality of through-holes and the at least one electrode pad, and
wherein the plurality of through-holes is formed in the resin filling provided in the at least one first penetration hole.

2. The substrate according to claim 1, wherein a difference between a coefficient of thermal expansion of the inorganic material base board and a coefficient of thermal expansion of the semiconductor device in a temperature range of 20° C. to 300° C. is about $1 \times 10^{-5}$/K or less.

3. The substrate according to claim 1, wherein the inorganic material base board is made of at least one of nitride ceramics, oxide ceramics, carbide ceramics, low-temperature cofired ceramics (LTCC), graphite, and metal silicon.

4. The substrate according to claim 1, wherein a thickness of the inorganic material base board under a bottom face of the recess is about 10 μm or more and about 250 μm or less.

5. A multilayer circuit board comprising:
a plurality of substrates, each comprising:
an inorganic material base board having a recess and at least one first penetration hole provided around the recess;
a semiconductor device accommodated in the recess and including at least one electrode pad provided on a surface of the semiconductor device;
resin filling provided in the at least one first penetration hole;
a plurality of second penetration holes formed in the resin filling in the at least one first penetration hole so as to penetrate the resin filling;
a plurality of through-holes including the plurality of second penetration holes and conductive material provided in the plurality of second penetration holes, and electrically connecting conductive wirings provided on a top surface and a back surface of the inorganic material base board; and
an insulating layer which covers the surface of the semiconductor device, a surface of the resin filling, and a surface of the inorganic material base board and which has a first opening corresponding to the plurality of through-holes and a second opening corresponding to the at least one electrode pad;

wherein the conductive wiring formed on a surface of the insulating layer for electrically connecting the plurality of through-holes and the at least one electrode pad, wherein the plurality of substrate, of which the plurality of through-holes is formed in the resin filling provided in the at least one first penetration hole, is layered, and wherein the plurality of substrates are bonded by bonding layers.

6. The multilayer circuit board according to claim 5, wherein a first substrate and a second substrate adjacent to the first substrate among the plurality of substrates are electrically connected to each other through at least one conductive bump.

* * * * *